United States Patent [19]

Towry

[11] Patent Number: 5,111,689
[45] Date of Patent: May 12, 1992

[54] BACKGROUND ILLUMINATION SIMULATOR

[75] Inventor: Elisa R. Towry, Fayetteville, Tenn.

[73] Assignee: The United States of America as represented by the Secretary of the Army, Washington, D.C.

[21] Appl. No.: 772,733

[22] Filed: Oct. 7, 1991

[51] Int. Cl.⁵ .......................................... G01M 19/00
[52] U.S. Cl. ...................................... 73/167; 102/293
[58] Field of Search ................. 73/167, 865.6; 102/293

[56] References Cited

U.S. PATENT DOCUMENTS

| | | | |
|---|---|---|---|
| 4,760,748 | 8/1988 | Katayanagi et al. | 73/865.6 |
| 4,874,952 | 10/1989 | Arnaud et al. | 73/865.6 X |
| 4,935,697 | 6/1990 | Paesch et al. | 73/167 X |

OTHER PUBLICATIONS

Technical Report RD-AS-90-1, "The Automated Laser Seeker Performance Evaluation System (ALSPES)" Dec. 1989.

Primary Examiner—Daniel M. Yasich
Attorney, Agent, or Firm—Freddie M. Bush; Howard G. Garner

[57] ABSTRACT

Testing apparatus for testing and evaluating the performance of laser seeking warheads for missiles under simulated weather conditions. The testing apparatus includes a support for supporting the warhead seeker and a laser for generating a laser beam, and for directing it towards the seeker. The laser beam extends through a diffusion screen which is interposed between the seeker support beams and the laser for diffusing the laser beam. A collimating lens is interposed between the diffusion screen and the seeker support for collimating the diffused laser beam and for directing the collimated laser beam onto the warhead seeker. A background illuminator is provided with an operating position between the diffusion screen and the collimating lens for simulating background lighting comparable to various weather conditions. The intensity of light generated by the background illuminator is varied by either individual rheostat controls or by a microprocessor. The microprocessor can also monitor the reaction of the seeker to the varied lighting conditions.

9 Claims, 3 Drawing Sheets

BACKGROUND ILLUMINATION SIMULATOR

DEDICATORY CLAUSE

The invention described herein may be manufactured, used, and licensed by or for the Government for governmental purposes without the payment to me of any royalties thereon.

BACKGROUND OF THE INVENTION

This invention relates to a testing apparatus for testing and evaluating the performance of laser seeking warheads for missiles.

The Automated Laser Seeker Performance Evaluation System (ALSPES) was built in the late 1970's for the purpose of testing laser semi-active seekers, such as those used on the Hellfire Missile and Copperhead Guided Projectile, to determine if there were any design abnormalities while performing specification compliance tests. Through the years, thousands of such seekers have been tested in ALSPES. During this time several design abnormalities have been identified and corrected.

The ALSPES facility is kept current as new technologies develop. The older, slower computers have been replaced with newer, faster models and all of the software has been rewritten to provide the operator with more capabilities. In addition, new lasers have been added to provide counter measure capability, particularly for the Hellfire Optimized Missile System (HOMS).

During the years, there have been many instances in which problems will develop during Fly-To-Buy (FTB) testing of Hellfire missiles that require bringing the missile seeker to the ALSPES for testing. Early in the FTB a missile experienced a lock-on problem in which it was determined that the sensitivity of the seeker was being degraded when the sun was in the field of view. The seeker was detached from the missile and brought to the ALSPES facility for testing primarily to determine the actual cause of the lock-on. The seeker was mounted in the ALSPES facility and tested for threshold sensitivity. This parameter measured the minimum amount of energy required for the seeker to acquire a target and to maintain correlation with the target for 3 minutes.

Without any background illumination or sun, the seeker passed the specification requirement. When several flood lights were added and placed in the field of view of the seeker, the sensitivity test was rerun several times and showed a significant degradation of the seeker sensitivity. It was also noted that after the flood lights were removed, the seeker was slow to recover. In order to determine whether all laser seekers behaved in this fashion, three lab models of the seeker were also tested in the same fashion. These seekers showed no significant degradation in sensitivity. As a matter of fact, one of the seekers improved. This seeker was returned to the contractor, who, after testing the seeker discovered that it had a bad sensor assembly. This in turn initiated tighter process controls at the contractor's facility.

More recently, a rash of failures have occurred during the FTB. These failures and the need to test more seekers for potential sun in the field of view problems requires a system and procedure of testing not available in the ALSPES. These problems resulted in the development of this invention.

SUMMARY OF THE INVENTION

It is an object of this invention to provide testing apparatus for testing and evaluating the performance of laser seeking warheads for missiles under simulated weather conditions.

It is a further object of this invention to provide a testing apparatus for testing and evaluating the performance of laser seeking warheads for missiles which can predict which seekers will have a higher probability of experiencing reduced sensitivity due to background illumination from the sun and/or other objects.

The invention comprises a testing apparatus for testing and evaluating the performance of the laser seeker warheads and provides means for supporting the warhead seeker. It includes laser means for generating a laser beam and for directing the laser beam towards the warhead seeker. A diffusion screen is interposed between the seeker support and the laser beam for diffusing the laser beam. A Collimating lens is interposed between the diffusion screen and the seeker support for collimating the diffused laser beam and for directing the collimated laser beam onto the warhead seeker, supported in the seeker support. The test device of the invention includes variable background illumination means for illuminating the seeker support and the seekers supported thereon, for movement into and out of an operating position between the diffusion means and the collimating lens for providing background lighting in simulation of weather lighting conditions. The testing apparatus of the invention also includes control means for controlling the intensity of the light provided by the illuminator to simulate a variety of weather conditions.

BRIEF DESCRIPTION OF THE DRAWINGS

An embodiment of the invention will now be described in connection with the appended drawings, in which.

DETAILED DESCRIPTION OF THE DRAWINGS

Figure 1:
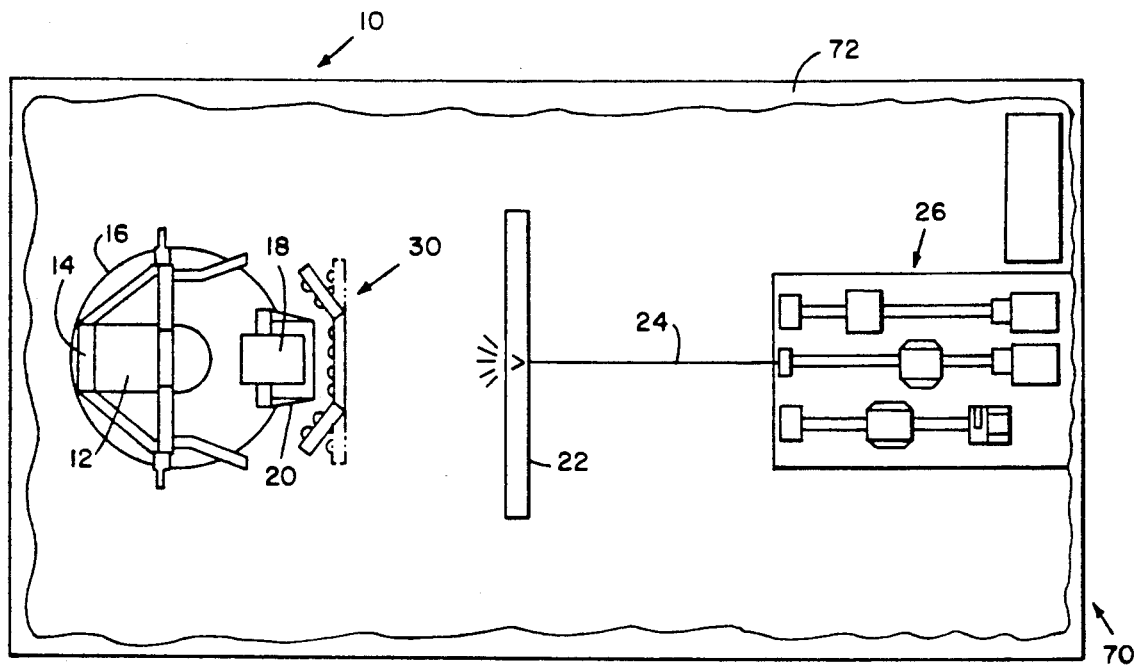
FIG. 1 is a schematic plan view of the testing apparatus of the invention.
Figure 5:
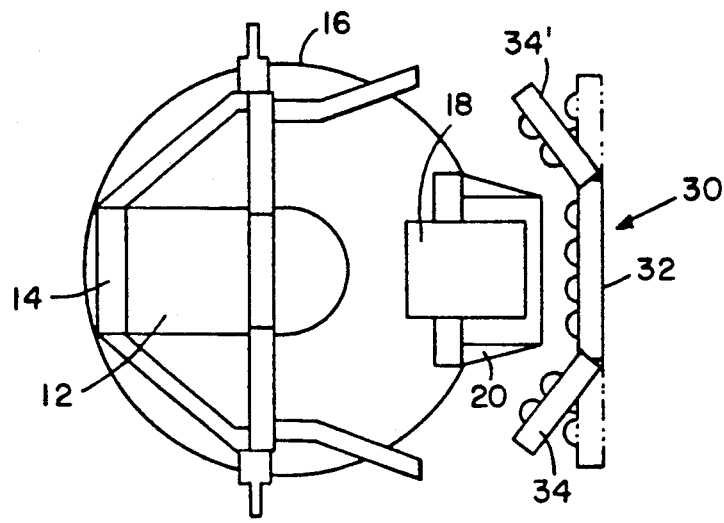
FIG. 5 is a detailed plan view of the background illumination simulator shown in FIG. 1.

Referring now to FIGS. 1 and 5 of the drawings, wherein is shown the testing apparatus 10 for testing laser seeking warheads 12 for missiles. As seen in FIG. 1, a warhead seeker 12 is mounted on a seeker support 14 on a two axis rotary-rate table 16. Disposed adjacent to the seeker support 14 is a radiometer 18 which maintains the stability of the laser beam. As seen in FIG. 1 and in FIG. 5, radiometer 18 is surrounded by collimating lens 20. Disposed adjacent to the collimating lens 20 is a background illuminator 30, which will be described in greater detail hereinafter.

To the right of FIG. 1 is a laser generating apparatus 26 for generating a laser beam 24. Laser beam 24 extends through a diffusion screen 22 towards the laser seeking warhead 14. The laser testing apparatus of FIG. 1 is enclosed in a dark room 70 which is lined with dark foam 72 for absorbing superflouous light.

The operation of the testing apparatus will now be described. A laser seeking warhead 12 is mounted on seeker support 14 on a two axis rotary-rate table 16. Laser beam 24 is directed toward the diffusion screen 22 and strikes screen 22 where it is diffused The diffused beam simulates the reflected energy returned from a tank or a similar target. The seeker looks through the collimating lens at the diffused laser energy. If the laser energy is of sufficient intensity, the laser seeking warhead will acquire or correlate on the energy and begin to track it.

The threshold sensitivity test is performed on a seeker warhead to determine the minimum amount of energy required for the seeker to maintain correlation and tracking of the laser energy for three minutes. This is the required specification test that all such seekers must pass before they are accepted by the Government.

The minimum amount of energy is determined by a computer by "bracketing" the energy levels until an energy level is reached that will allow the seeker to remain correlated for one full minute. The energy ($J/cm^2$) is converted to a decibel (dB) value referenced to the specification energy unless the raw data is needed for other purposes.

The background illumination simulator 30, which will be described in more detail hereinafter, is located in front of the seeker so that the light from the simulator 30 is directed into the seeker's field of vision. Due to the design of the support 14, the laser energy or beam 24 will not be blocked but most of the light diffused by the diffusion screen 22 will be projected into the seeker field of vision through the collimating lens 20. As will be described later, the background illuminator 30 is adjustable to make sure the entire field of view of the seeker 14 is covered.

Through the use of the background illuminator 30 the engineer running the test can predict which seekers will have a higher probability of experiencing reduced sensitivity due to the background illumination from the sun or from other objects. This will allow for sufficient time to make corrections to the hardware structure or to the manufacturing processes to make the seeker more dependable.

Figure 2:
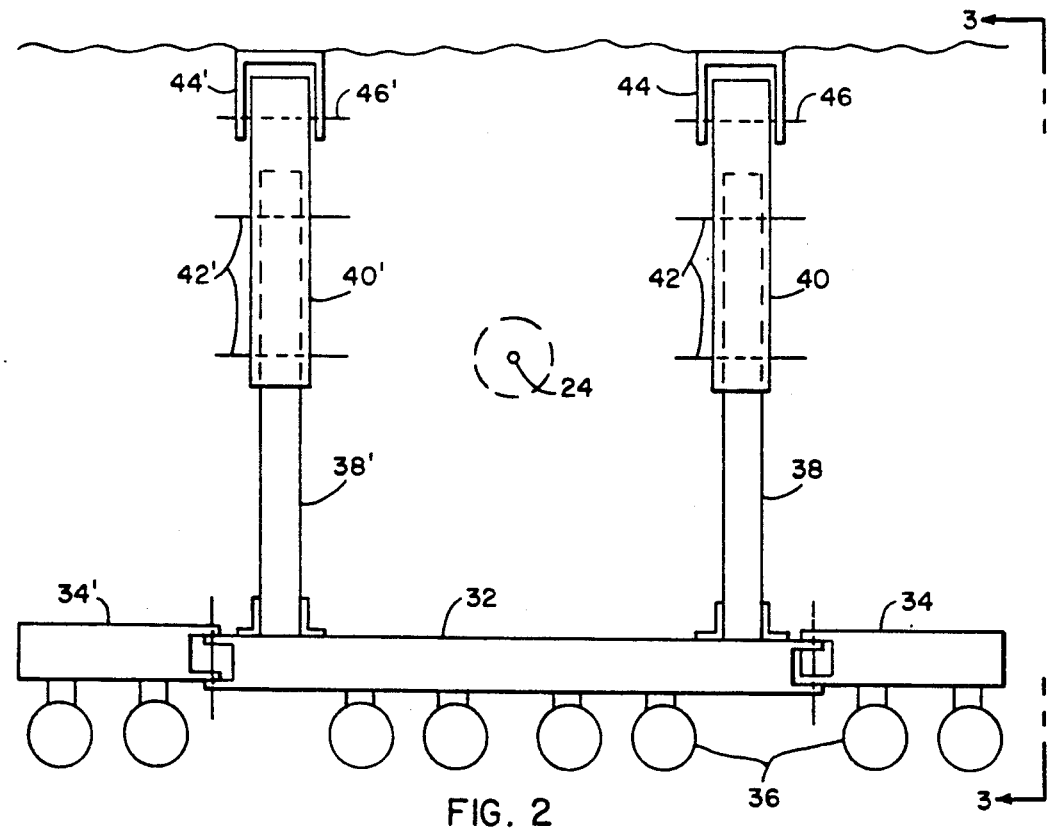
FIG. 2 is front view of the background illuminating device and supports therefor.

Referring now to FIG. 2, wherein the background illuminator 30 is illustrated in more detail. The background illuminator 30 comprises a light bar 32, having 2 light bar extensions 34 and 34', for supporting a plurality of flood lights or lamps 36. A pair of lower support arms 38 and 38' support light bar 34 and are telescoped into upper support arms 40 and 40', respectively, and are supported at variable heights therein by pins 42 and 42', respectively.

Figure 3:
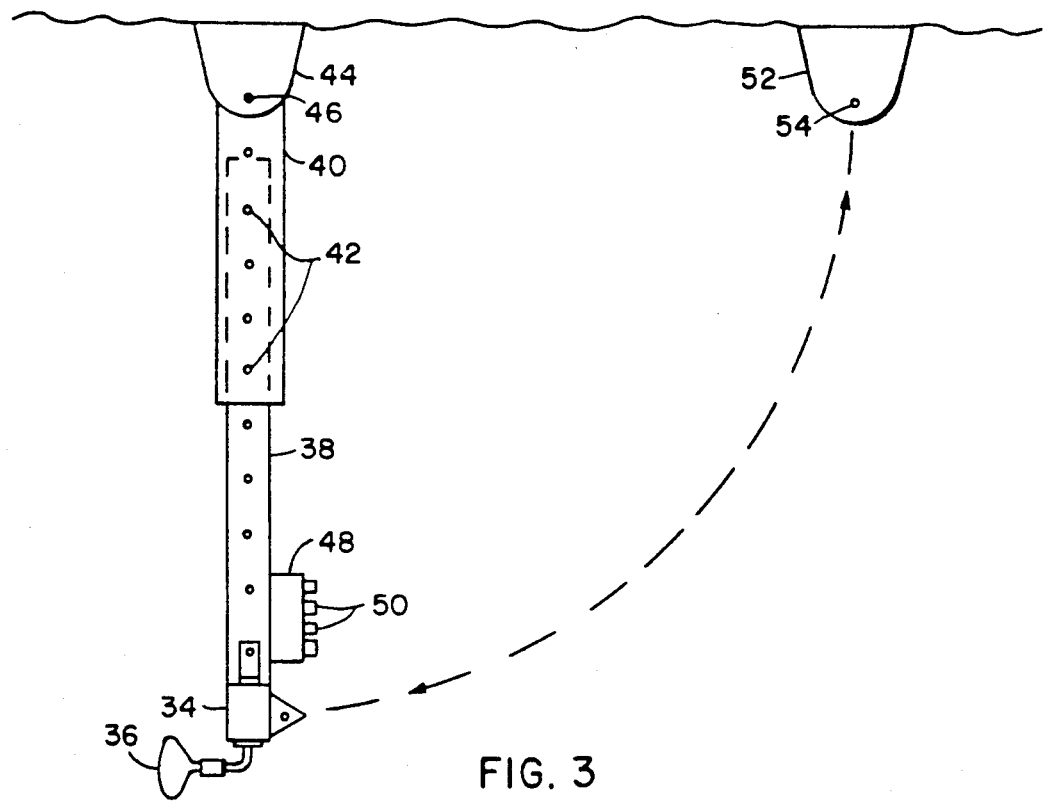
FIG. 3 is a side view of the testing apparatus taken along line III—III in FIG. 2.

Upper support arms 40 are pivotally mounted in U-shaped brackets 44 and 44' by hinge pins 46 and 46'. Thus, as seen in FIG. 3, light bar 32 and its supporting arms are suspended from the ceiling when in use and can be swung to a position out of the field of view or vision of the seeker whenever this is desirable. In this case, the lower brackets 38 and 38' are supported by locking brackets 52 with locking pins 54.

The intensity of the light emitted by flood lamps 36 in this embodiment is individually controlled by a series of rheostat switches 50 on control box 48 to permit variation in the intensity of the background illumination light.

Figure 4:
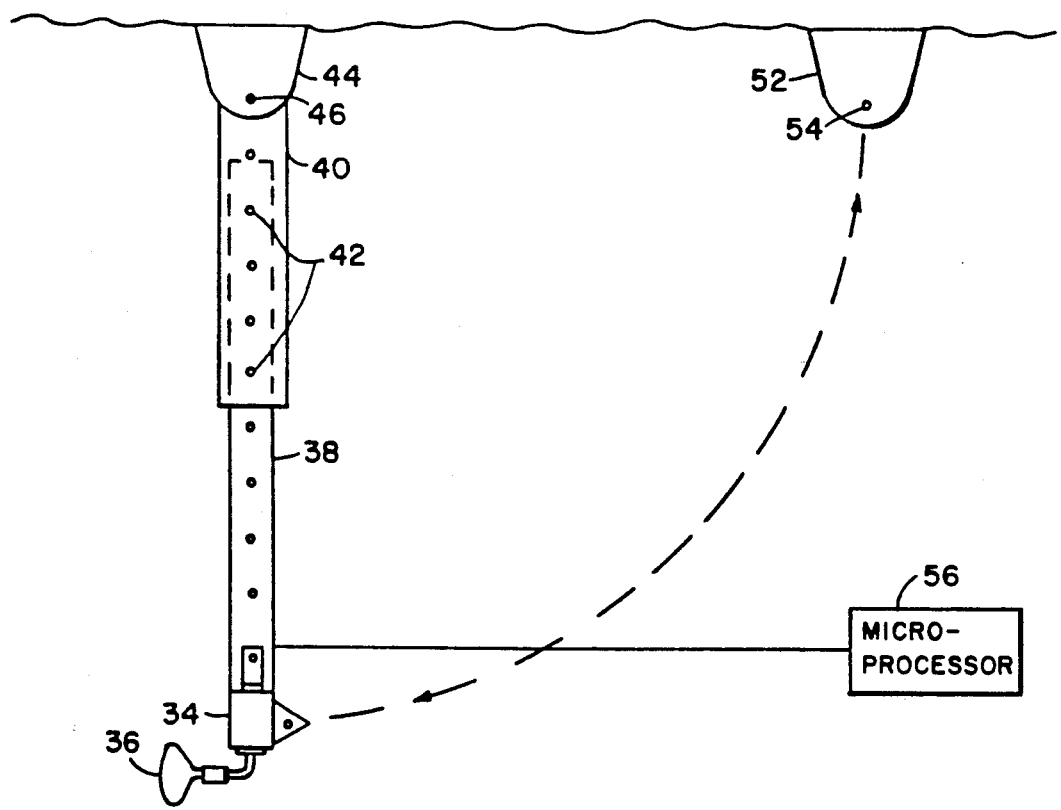
FIG. 4 is a view similar to FIG. 3 showing another embodiment of the invention.

Referring now to FIG. 4 which is a view similar to that shown in FIG. 3 wherein the intensity of the light emitted by flood lamps 36 is controlled by a computer or microprocessor 56 which will control the intensity of the light emitted by the flood lamps automatically for the varying conditions to be tested.

FIG. 5 is an enlarged view of the background illuminator 30, the collimating lens 20, the radiometer 18, the seeker 12, the seeker support 14, and the two axis rotary-rate table 16. This structure has already been described in detail hereinbefore and will not be further described at this point.

Figure 6:
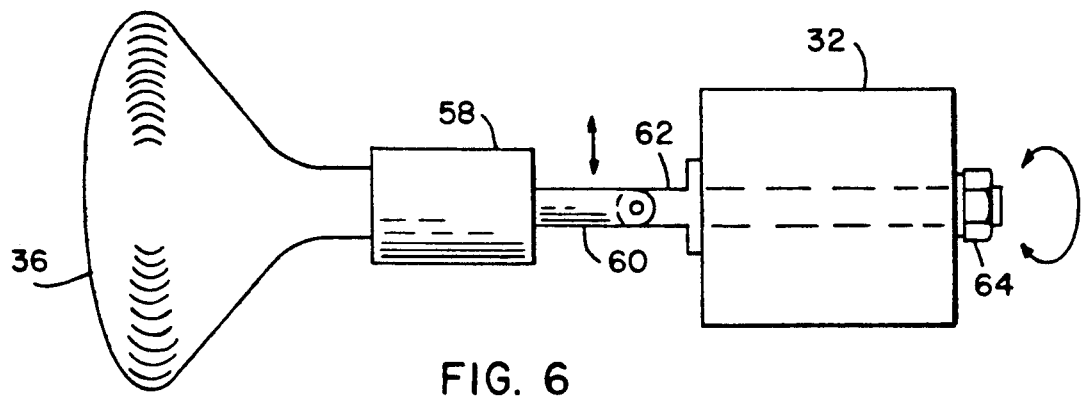
FIG. 6 is a side view of a supporting apparatus for supporting individual illuminating lamps for adjustment of a full 360 degrees in a plane.

Referring now to FIG. 6 wherein a detail of the support for the flood lamp 36 is illustrated. In this view, flood lamp 36 is mounted in a socket 58 which is supported by support shaft 60. Support shaft 60 is pivotally connected to support shaft extension 62 which is supported in light bar 32 for rotary movement therein. Support shaft extension 62 is held in place by an anchor nut 64. The angle of the light 36 is adjustable by adjusting the pivot between support shaft 60 and support shaft extension 62 and by adjusting the position of support shaft 62 rotatably within light bar 32.

Figure 7:
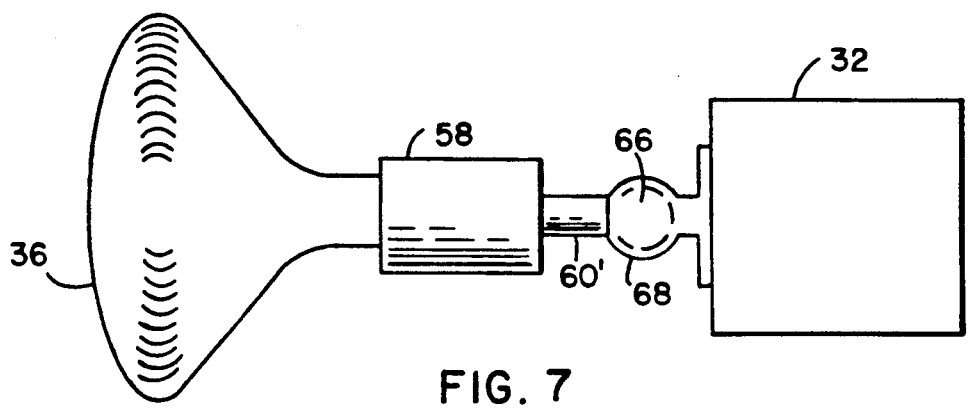
FIG. 7 is a view similar to that shown in FIG. 6 showing an alternate support means for supporting the individual illuminating means for adjustment over 360 degrees in a plane.

FIG. 7 is a view similar to FIG. 6 showing an alternate means for supporting flood lamp 36. Here, flood lamp 36 is supported in a flood lamp socket 58 mounted on a support shaft 60'. In this embodiment support shaft 60, ends in a support ball 66 which is supported in a support bracket 68 for rotary and angular movement therein. Bracket 68 in turn is supported by light bar 32.

While several embodiments of the invention have been described hereinabove, it will be appreciated that the testing apparatus of the invention is not limited to any specific form. The scope of the invention will be defined by the claims appended hereto.

I claim:

1. A testing apparatus for testing and evaluating the performance of laser seeking warheads for missiles, under simulated weather conditions, comprising:
   (a) support means for supporting a warhead seeker;
   (b) laser means for generating a laser beam and for directing a laser beam towards said seeker;
   (c) a diffusion screen interposed between said seeker support means and said laser means for diffusing said laser beam;
   (d) a collimating lens interposed between said diffusion screen and said seeker support means for collimating the diffused laser beam and for directing said collimated laser beam onto a warhead seeker, supported in said seeker support;
   (e) background illuminator means for illuminating said seeker support and a seeker disposed therein, supported for movement into and out of an operating position between said diffusion means and said collimating lens for providing background lighting in simulation of weather lighting conditions; and
   (f) control means for controlling the intensity of the light provided by said illuminator means to simulate various weather conditions.

2. A testing apparatus as set forth in claim 1, wherein said background illuminator is supported for movement on a frame pivotally supported outside of said operating position.

3. A testing apparatus as set forth in claim 1, wherein said testing apparatus is enclosed in a dark room.

4. A testing apparatus as set forth in claim 3, wherein said control means is disposed within said dark room.

5. A testing apparatus as set forth in claim 3, wherein said control means is located outside of said dark room.

6. A testing apparatus as set forth in claim 1, wherein said background illuminator comprises a plurality of flood lamps for illuminating said seeker support and seekers disposed thereon, and said control means comprises individual rheostats for each of said flood lamps.

7. A testing apparatus as set forth in claim 1, wherein the height of said background illuminator means is adjustable.

8. A testing apparatus as set forth in claim 1, wherein said control means comprises a microprocessor.

9. A testing apparatus as set forth in claim 1, wherein said microprocessor is programmed to simulate various environments and to record the responses of said seeker thereto.

* * * * *